United States Patent
Yoon et al.

(10) Patent No.: US 9,480,145 B2
(45) Date of Patent: Oct. 25, 2016

(54) APPARATUS FOR CONTROLLING RESONANCE FREQUENCY OF DEVICE SUBJECT TO WIRELESS POWER TRANSMISSION INTERFERENCE AND METHOD THEREOF

(71) Applicant: SAMSUNG ELECTRONICS CO., LTD., Suwon-si (KR)

(72) Inventors: Chang Wook Yoon, Seoul (KR); Sang Wook Kwon, Yongin-si (KR); Nam Yun Kim, Seoul (KR); Dong Zo Kim, Yongin-si (KR); Yun Kwon Park, Dongducheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 477 days.

(21) Appl. No.: 14/024,867

(22) Filed: Sep. 12, 2013

(65) Prior Publication Data

US 2014/0071644 A1 Mar. 13, 2014

(30) Foreign Application Priority Data

Sep. 12, 2012 (KR) ........................ 10-2012-0100868

(51) Int. Cl.
*H01F 27/42* (2006.01)
*H01F 37/00* (2006.01)
(Continued)

(52) U.S. Cl.
CPC .......... *H05K 1/0216* (2013.01); *H05K 1/0231* (2013.01); *H05K 1/0262* (2013.01);
(Continued)

(58) Field of Classification Search
CPC .......... H02J 5/005; H02J 17/00; H02J 7/025;
H02J 7/0042; H02J 3/383; H02J 7/0044;
H02J 13/0082; H02J 1/00; H02J 1/102;
H02J 2001/106; H02J 2009/007; H02J 3/01;
H02J 7/0004; H02J 7/0008; H02J 7/00
USPC ........................................ 307/104
See application file for complete search history.

(56) References Cited

U.S. PATENT DOCUMENTS 4,960,983 A * 10/1990 Inoue ................. G06K 7/10336
235/449
6,515,868 B1 * 2/2003 Takahashi ............ H05K 1/0231
361/502

(Continued)

FOREIGN PATENT DOCUMENTS

JP 9-223861 A 8/1997
JP 2011-9291 A 1/2011

(Continued)

OTHER PUBLICATIONS

International Search Report and Written Opinion of the Searching Authority mailed Dec. 23, 2013 in counterpart International Application No. PCT/KR2013/008255 (9 pages, in English).

(Continued)

*Primary Examiner* — Jared Fureman
*Assistant Examiner* — Esayas Yeshaw
(74) *Attorney, Agent, or Firm* — NSIP Law (57) ABSTRACT

Provided is an apparatus and method to control a resonance frequency of a device subject to wireless power transmission interference. The apparatus and method include supplying power from a printed circuit board (PCB) to an integrated circuit (IC) during exposure to a wireless power transmission environment experiencing mutual resonance. The apparatus and method also include a resonance frequency of the PCB based on a change in the supply of power.

24 Claims, 9 Drawing Sheets

(51) Int. Cl.
*H01F 38/00* (2006.01)
*H05K 1/02* (2006.01)

(52) U.S. Cl.
CPC ... *H05K1/0243* (2013.01); *H05K 2201/10053* (2013.01); *H05K 2201/10098* (2013.01); *H05K 2201/10151* (2013.01); *H05K 2201/10196* (2013.01)

(56) References Cited

U.S. PATENT DOCUMENTS

| | | | |
|---|---|---|---|
| 8,952,792 B1* | 2/2015 | Srinivas | H04Q 5/22 340/10.1 |
| 2003/0084415 A1 | 5/2003 | Sasaki et al. | |
| 2003/0193791 A1* | 10/2003 | Panella | H01L 23/49805 361/764 |
| 2007/0291459 A1 | 12/2007 | Hsu et al. | |
| 2009/0039964 A1* | 2/2009 | Hijikata | H03F 1/0205 330/305 |
| 2009/0058558 A1 | 3/2009 | Okano | |
| 2009/0153239 A1 | 6/2009 | Toffolon et al. | |
| 2009/0167617 A1* | 7/2009 | Nishio | H01Q 9/0421 343/702 |
| 2009/0243397 A1 | 10/2009 | Cook et al. | |
| 2009/0268369 A1* | 10/2009 | Chen | H01G 4/012 361/303 |
| 2011/0193417 A1 | 8/2011 | Hirasaka et al. | |
| 2012/0081859 A1* | 4/2012 | Christo | H05K 1/0263 361/736 |
| 2013/0002034 A1* | 1/2013 | Onizuka | H02J 5/005 307/104 |
| 2013/0307640 A1* | 11/2013 | Wada | H01P 1/20381 333/134 |

FOREIGN PATENT DOCUMENTS

| | | |
|---|---|---|
| KR | 10-2008-0063213 A | 7/2008 |
| KR | 10-2009-0057350 A | 6/2009 |
| KR | 10-2011-0071689 A | 6/2011 |
| KR | 10-2011-0127203 A | 11/2011 |
| KR | 10-2012-0067564 A | 6/2012 |

OTHER PUBLICATIONS

"MT-101 Tutorial Decoupling Techniques What is Proper Decoupling and Why is it Necessary?", Mar. 1, 2009, XP055248099, Retrieved from the Internet: URL:http://www.analog.com/media/en/training-seminars/tutorials/MT-101.pdf (14 pages in English).

Extended European Search Report issued on Jun. 16, 2016 in counterpart European Application No. 13837194.3. (9 pages in English).

* cited by examiner

APPARATUS FOR CONTROLLING RESONANCE FREQUENCY OF DEVICE SUBJECT TO WIRELESS POWER TRANSMISSION INTERFERENCE AND METHOD THEREOF

CROSS-REFERENCE TO RELATED APPLICATION(S)

This application claims the benefit under 35 U.S.C. §119 (a) of Korean Patent Application No. 10-2012-0100868, filed on Sep. 12, 2012, in the Korean Intellectual Property Office, the entire disclosure of which is incorporated herein by reference for all purposes.

BACKGROUND

1. Field

The following description relates to an apparatus and method to control a resonance frequency of a device subject to wireless power transmission interference.

2. Description of Related Art

Research on wireless power transmission has been ongoing to alleviate increasingly inconveniences caused by wired power supplies and limited capacity of batteries resulting from a rapid usage increase from a number of various mobile devices, such as electric vehicles and mobile electronic devices. Some wireless power transmission technologies use resonance characteristics of radio frequency (RF) devices.

An electronic device may be exposed to a magnetic field of a wireless power transmission apparatus using resonance characteristics when the electronic device is located near the wireless power transmission apparatus. In this case, however, an error may occur during operation of the electronic device exposed to the magnetic field.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an apparatus to control a device subject to wireless power transmission interference. The apparatus includes a printed circuit board (PCB) configured to supply power to an integrated circuit (IC) during exposure to a wireless power transmission environment; and a resonance frequency control unit configured to control a resonance frequency of the PCB based on the supply of power.

The PCB includes a power plane configured to supply power from a power source to the IC through a printed path on the PCB; and a ground plane configured to ground the power source and the IC.

The resonance frequency control unit includes a measuring unit configured to measure an amount of power supplied to the IC; a determining unit configured to determine whether the amount of power is within a range; and a detecting unit configured to detect wireless power transmission interference having mutual resonance when the amount of power measured is outside the range.

The detecting unit is configured to detect a malfunction in the IC.

The PCB includes a variable capacitor operatively connected between the power plane and the ground plane, and the resonance frequency control unit includes a capacitor capacity determining unit configured to determine a capacity of the variable capacitor based on the change in the supply of power.

The capacitor capacity determining unit is configured to decrease the capacity of the variable capacitor to increase the resonance frequency of the PCB to be higher than a resonance frequency of a wireless power transmission apparatus experiencing mutual resonance.

The capacitor capacity determining unit is configured to increase the capacity of the variable capacitor to decrease the resonance frequency of the PCB to be lower than a resonance frequency of a wireless power transmission apparatus experiencing mutual resonance.

The resonance frequency control unit is configured to control the resonance frequency of the PCB to a frequency, irrespective of the change in the supply of power from the PCB.

The IC chip is supplied with power from the power source through a conduit operatively connecting the power plane to the ground plane.

The PCB includes capacitors operatively connected between the power plane and the ground plane, and the resonance frequency control unit includes a switch control unit configured to control a switch to increase the resonance frequency of the PCB to be higher than a resonance frequency of a wireless power transmission apparatus experiencing mutual resonance, the switch being configured to operatively connect the capacitors to the power plane and the ground plane.

The switch control unit is configured to operatively connect the plurality of capacitors to the power plane and the ground plane in parallel and controlling a switch to reduce the resonance frequency of the PCB to be lower than a resonance frequency of a wireless power transmission apparatus experiencing mutual resonance.

The apparatus includes a communication unit configured to transmit and receive information associated with a resonance frequency of a wireless power transmission apparatus experiencing mutual resonance and information associated with the resonance frequency of the PCB to and from the wireless power transmission apparatus.

In accordance with an illustrative example, there is provided a method of controlling a device, the method includes supplying power from a printed circuit board (PCB) to an integrated circuit (IC) during exposure to a wireless power transmission environment; and controlling a resonance frequency of the PCB based on the supply of power.

The controlling includes measuring an amount of power supplied to the IC; determining whether the amount of power measured is within a range; and detecting wireless power transmission interference having mutual resonance when the amount of power measured is outside the range.

The PCB includes a variable capacitor configured to change the resonance frequency of the PCB, and the controlling further includes determining a capacity of the variable capacitor based on the change in the supply of power from the PCB when the wireless power transmission interference having mutual resonance is detected.

The PCB includes capacitors configured to change the resonance frequency of the PCB, and the controlling further includes operatively connecting the capacitors to the PCB in a connection configuration of a series connection and a parallel connection when the wireless power transmission interference having mutual resonance is detected.

The method also includes transmitting and receiving information associated with a resonance frequency of a wireless power transmission apparatus experiencing mutual resonance and information associated with a resonance frequency of the PCB to and from the wireless power transmission apparatus experiencing mutual resonance.

In accordance with an illustrative example, there is provided an apparatus to control a device subject to wireless power transmission interference including a variable capacitor configured to adjust a capacity of a printed circuit board (PCB) and enable to PCB to supply power to an integrated circuit (IC); and a resonance frequency control unit configured to control a resonance frequency of the PCB by adjusting the capacity of the variable capacitor based on the power supplied to the IC.

The resonance frequency control unit changes the capacity of the variable capacitor when wireless power transmission interference with mutual resonance is detected between the device and the PCB or when the IC malfunctions.

The resonance frequency control unit changes the resonance frequency of the PCB when a value of electric current input to the IC or a value of voltage applied to the IC is outside a range.

The variable capacitor is integrated into the PCB, operatively connected between a power plane and a ground plane of the PCB.

The resonance frequency control unit determines a larger capacity of the variable capacitor as the change in power being supplied is larger and when a change in the resonance frequency of the PCB is greater.

The resonance frequency control unit determines a lower capacity of the variable capacitor as the change in a supply of power decreases and when a change in the resonance frequency of the PCB is lower.

The resonance frequency control unit calculates an amount of power supplied to the IC periodically or irregularly in real-time.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

When an electronic device is exposed to a strong magnetic field, energy from the magnetic field may be delivered to a nearby electronic device. In particular, in a case of wireless power transmission using a resonance method, a great amount of energy may be delivered to an electronic device with a resonance frequency band.

An electronic device may use a printed circuit board (PCB), and the PCB may include a power plane and a ground plane. A capacitor may be formed between the power plane and the ground plane, and the power plane, the ground plane, and a power source may be modeled as an inductor. Accordingly, a connection between the inductor and the capacitor may produce resonance in the PCB.

A resonance frequency at which resonance occurs has a band of low frequencies close to a band of frequencies of magnetic fields used in wireless power transmission, for example, several kilohertz (KHz) to several megahertz (MHz). When an electronic device is placed near a magnetic field used in wireless power transmission, the electronic device may resonate with a wireless power transmission apparatus, resulting in an unstable supply of power from the power plane and the ground plane of a PCB of the electronic device. The unstable supply of power may cause a malfunction in an electronic component existing on the PCB, resulting in overall degradation of wireless power transmission apparatus performance.

Figure 1:
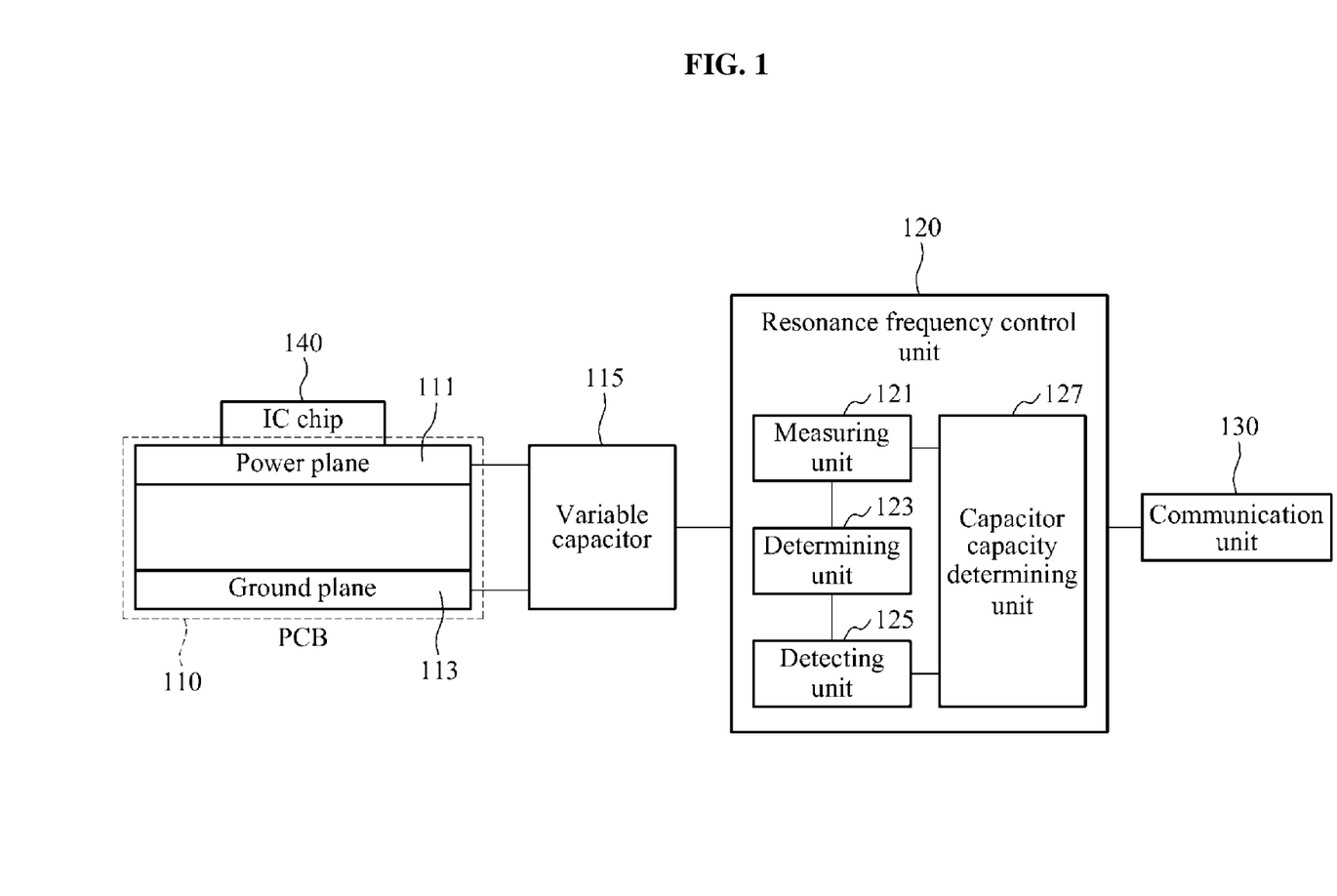
FIG. 1 is a block diagram illustrating an apparatus to control a resonance frequency of a device subject to wireless power transmission interference, according to an embodiment.

FIG. 1 is a block diagram illustrating an apparatus to control a resonance frequency of a device subject to wireless power transmission interference, according to an embodiment.

Referring to FIG. 1, the apparatus to control the resonance frequency of a device subject to wireless power transmission interference, according to an embodiment includes a PCB 110, a resonance frequency control unit 120, a communication unit 130, and an integrated circuit (IC) chip 140.

The PCB 110 supplies power to the IC chip 140, while exposed to a wireless power transmission environment having or experiencing mutual resonance. Exposure to the wireless power transmission environment having mutual resonance is an effect of interference in a wireless power transmission environment caused by a magnetic field generated from a wireless power transmission apparatus (not shown) when a resonance frequency of the wireless power transmission apparatus is equal to a resonance frequency of the PCB 110. In this case, the PCB 110 would be located within a power transmission coverage of the wireless power transmission apparatus.

For example, the IC chip 140 includes a semiconductor chip, and corresponds to a chip that performs various types of electrical signal processing including communication signal processing, heat generation, and/or light emission. The IC chip 140 may be attached to one surface of the PCB 110.

The PCB 110 includes a power plane 111, a ground plane 113, and a variable capacitor 115.

The power plane 111 supplies power from a power source (not shown) to the IC chip 140 through a printed path on the PCB 110. In an alternative configuration, a plurality of IC chips 140 may be disposed on the PCB 110. The path enabling a supply of power between the IC chips 140 or between the power source and the IC chip 140 may be printed beforehand on the PCB 110.

The ground plane 113 grounds the power source and the IC chip 140.

The variable capacitor 115 may be operatively connected between the power plane 111 and the ground plane 113. The variable capacitor 115 may correspond to a capacitor between the power plane 111 and the ground plane 113, of which a capacity may be adjusted to adjust an overall capacitance of the PCB 110. Although the variable capacitor 115 is illustrated to be external to the PCB 110, in an alternative configuration, the variable capacitor 115 may be an integral part of the PCB 110, operatively connected between the power plane 111 and the ground plane 113. Furthermore, in an alternative configuration, the variable capacitor 115 may be an integral part of the resonance frequency control unit 120, operatively connected between the power plane 111 and the ground plane 113. The resonance frequency control unit 120 controls a resonance frequency of the PCB 110 based on a change in a supply of power from the PCB 110 to the IC chip 140. The resonance frequency control unit 120 controls the resonance frequency of the PCB 110 by adjusting the capacity of the variable capacitor 115.

The IC chip 140 may be configured to operate in a predetermined range of input current or input voltage. The resonance frequency control unit 120 changes the resonance frequency of the PCB 110 when a value of electric current input to the IC chip 140 or a value of voltage applied to the IC chip 140 is outside a predetermined range.

Also, the resonance frequency control unit 120 controls the resonance frequency of the PCB 110 to a preset frequency, irrespective of the change in power supply from the PCB 110. The resonance frequency control unit 120 changes the resonance frequency of the PCB 110 to the preset frequency by controlling the capacity of the variable capacitor 115, irrespective of the change in power supply from the PCB 110. The preset frequency may be set to frequencies in a range outside a frequency range for wireless power transmission, for example, several kHz to hundreds of hertz (Hz).

The resonance frequency control unit 120 includes a measuring unit 121, a determining unit 123, a detecting unit 125, and a capacitor capacity determining unit 127.

In an illustrative example, the measuring unit 121 measures an amount of power supplied to the IC chip 140. The measuring unit 121 measures a value of an electric current input to the IC chip 140. The measuring unit 121 measures a value of a voltage applied to the IC chip 140. The measuring unit 121 calculates an amount of power supplied to the IC chip 140 based on the measured current value and the measured voltage value.

The measuring unit 121 measures the amount of power supplied to the IC chip 140 periodically or measures the amount of power supplied to the IC chip 140 irregularly. Further, the measuring unit 121 measures the amount of power supplied to the IC chip 140 in real time.

The determining unit 123 determines whether the amount of power measured by the measuring unit 121 is within a preset allowable range. The allowable range may represent a range of amounts of power receivable by the IC chip 140. The allowable range may be preset during design stage of the IC chip 140. In one example, the allowable range may differ based on purposes of electronic components, and may be set to be within 3 watts (W) to 5 W.

The detecting unit 125 detects wireless power transmission interference when the amount of power measured by the measuring unit 121 is outside the preset allowable range. For example, when the amount of power measured by the measuring unit 121 is 6 W, the detecting unit 125 detects the wireless power transmission interference with mutual resonance and determines that the IC chip 140 is malfunctioning. For example, when a value of electric current or voltage output from the IC chip 140 is outside a preset range, the detecting unit 125 detects a malfunction in the IC chip 140.

The capacitor capacity determining unit 127 changes the capacity of the variable capacitor 115 when wireless power transmission interference with mutual resonance is detected at the detecting unit 125. In the alternative, the capacitor capacity determining unit 127 changes the capacity of the variable capacitor 115 when a malfunction in the IC chip 140 is detected at the detecting unit 125.

The capacitor capacity determining unit 127 determines the capacity of the variable capacitor 115 based on the change in power supplied from the PCB 110. The capacitor capacity determining unit 127 determines a larger capacity of the variable capacitor 115 as the change in power being supplied is larger. In this instance, the larger the capacity of the variable capacitor 115, the greater a change in the resonance frequency of the PCB 110. In contrast, the capacitor capacity determining unit 127 determines a lower capacity of the variable capacitor 115 as the change in a supply of power decreases. The capacitor capacity determining unit 127 determines the capacity of the variable capacitor 115 in proportion to a change in power supply.

The capacitor capacity determining unit 127 reduces the capacity of the variable capacitor 115 to increase the resonance frequency of the PCB 110 to be higher than a resonance frequency of the wireless power transmission apparatus having mutual resonance or experiencing mutual resonance. When the capacity of the variable capacitor 115 is reduced, a capacitance of the PCB 110 may be reduced. When the capacitance of the PCB 110 is reduced, the resonance frequency of the PCB 110 increases.

In an example, the capacitor capacity determining unit 127 increases the capacity of the variable capacitor 115 to decrease the resonance frequency of the PCB 110 to be lower than a resonance frequency of the wireless power transmission apparatus experiencing mutual resonance. When the capacity of the variable capacitor 115 is increased, the capacitance of the PCB 110 is increased. When the capacitance of the PCB 110 is increased, the resonance frequency of the PCB 110 decreases.

In an example, the communication unit 130 transmits and receives information associated with the resonance frequency of the wireless power transmission apparatus experiencing mutual resonance and information associated with the resonance frequency of the PCB 110 to and from the wireless power transmission apparatus. The resonance frequency control unit 120 controls the resonance frequency of the PCB 110 based on the information associated with the resonance frequency of the wireless power transmission apparatus received at the communication unit 130.

The IC chip 140 is supplied with power from the power source through a conduit (not shown) operatively connecting the power plane 111 to the ground plane 113.

Figure 2:
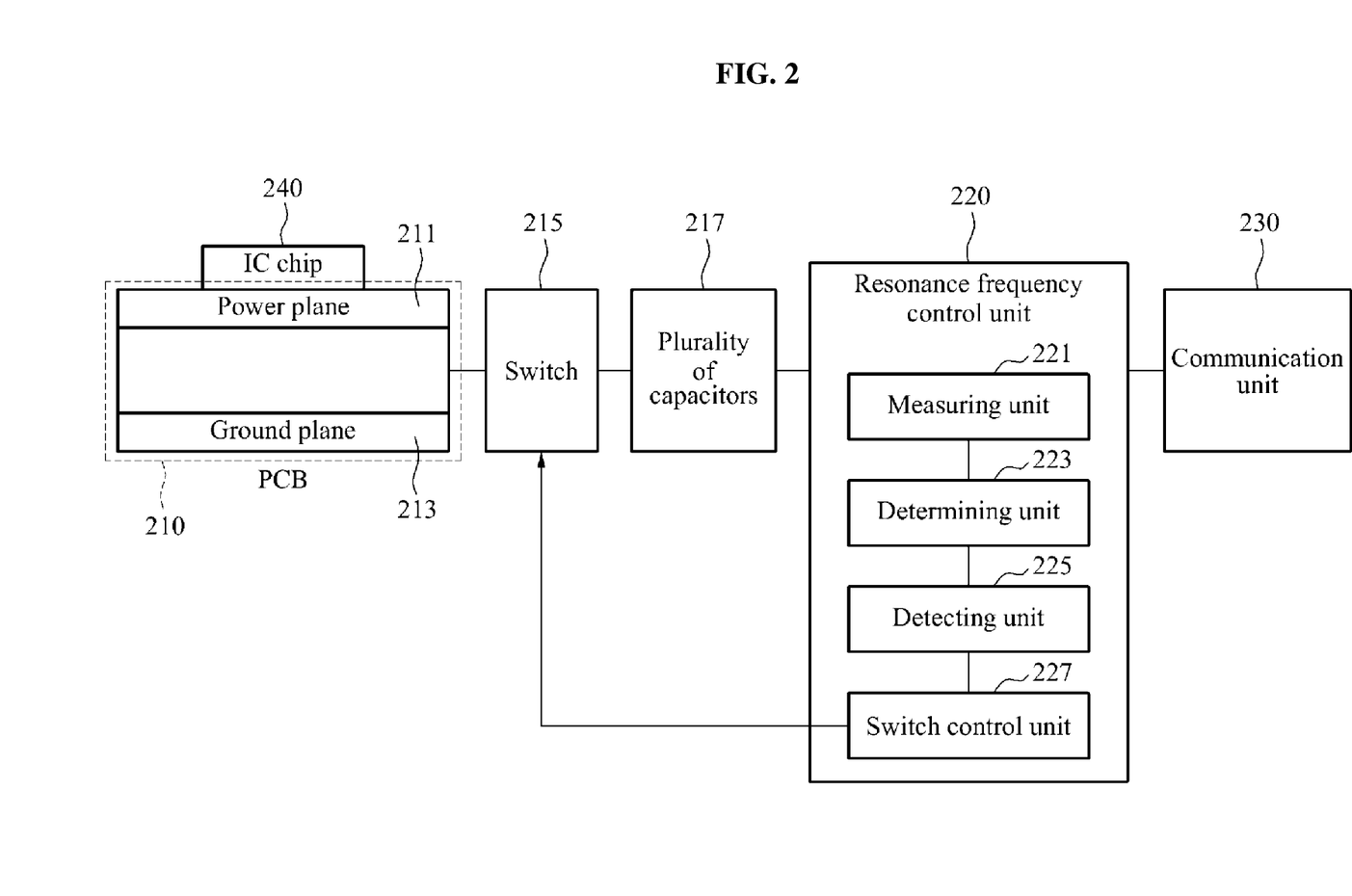
FIG. 2 is a block diagram illustrating an apparatus to control a resonance frequency of the device subject to wireless power transmission interference, according to another embodiment.

FIG. 2 is a block diagram illustrating an apparatus to control a resonance frequency of the device subject to wireless power transmission interference, according to another embodiment.

Referring to FIG. 2, the apparatus to control the resonance frequency of the device subject to wireless power transmission interference according to another exemplary embodiment includes a PCB 210, a resonance frequency control unit 220, a communication unit 230, and an IC chip 240. A different configuration from the apparatus of FIG. 1 may entail a plurality of capacitors 217 operatively connected to the PCB 210, a switch 215 operatively connecting the plurality of capacitors 217 to the PCB 210, and a switch control unit 227 controlling an operation of the switch 215.

The PCB 210 supplies power to the IC chip 240 while exposed to a wireless power transmission environment with mutual resonance. Exposure to the wireless power transmission environment with mutual resonance have a possible effect of interference caused by a magnetic field generated from a wireless power transmission apparatus (not shown) when a resonance frequency of mutual resonance is equal to a resonance frequency of the PCB 210. Also, a case in which the PCB 210 is located within a power transmission coverage of the wireless power transmission apparatus may also have the effect of interference caused by the magnetic field from the wireless power transmission apparatus.

Furthermore, the IC chip 240 may include a semiconductor chip, and may correspond to a chip that may perform various forms of electrical signal processing including communication signal processing, heat generation, and/or light emission. The IC chip 240 may be attached to any one of the surfaces of the PCB 210.

The PCB 210 may include a power plane 211, a ground plane 213, a switch 215, and a plurality of capacitors 217. Although the switch 215 is illustrated in FIG. 2 as being separately configured from the PCB 210, it can be appreciated that the switch 215 may be an integral part of the PCB 210.

The power plane 211 supplies power from a power source (not shown) to the IC chip 240 through a printed path on the PCB 210. In a configuration, the IC chips 240 are disposed on the PCB 210. The path enabling a power supply between the IC chips 240 or between the power source and the IC chip 240 may be printed beforehand on the PCB 210.

The ground plane 213 grounds the power source and the IC chip 240.

The switch 215 operatively connects the plurality of capacitors 217 to the PCB 210 in series or in parallel. A capacitor of the plurality of capacitors 217 may be formed between the power plane 211 and the ground plane 213, and an overall capacitance of the PCB 210 may be adjusted through connections of the plurality of capacitors 217. The plurality of capacitors 217 may have at least one connection configuration to one another of a series connection and a parallel connection.

The resonance frequency control unit 220 controls a resonance frequency of the PCB 210 based on a change in a supply of power from the PCB 210. The resonance frequency control unit 220 controls the resonance frequency of the PCB 210 by connecting the plurality of capacitors 217 to the PCB 210 in series or in parallel.

The IC chip 240 is preset to operate at a predetermined range of input current or input voltage. When a value of electric current input to the IC chip 240 or a value of voltage applied to the IC chip 240 is outside a preset range, the resonance frequency control unit 220 changes the resonance frequency of the PCB 210.

Also, the resonance frequency control unit 220 controls the resonance frequency of the PCB 210 to a preset frequency irrespective of the change in the power supply from the PCB 210. The resonance frequency control unit 220 changes the resonance frequency of the PCB 210 to the preset frequency by connecting the plurality of capacitors 217 to the PCB 210 in series or in parallel, irrespective of the change in the power supply to the IC chip 240. The preset frequency is set to frequencies that are generally unused for wireless power transmission, for example, several kHz to hundreds of Hz.

The resonance frequency control unit 220 includes a measuring unit 221, a determining unit 223, a detecting unit 225, and a switch control unit 227.

The measuring unit 221 measures an amount of power supplied to the IC chip 240. The measuring unit 221 measures a value of electric current input to the IC chip 240. The measuring unit 221 measures a value of voltage applied to the IC chip 240. The measuring unit 221 calculates an amount of power supplied to the IC chip 240 based on the measured current value and the measured voltage value. The measuring unit 221 measures the amount of power supplied to the IC chip 240 periodically, or measures the amount of power supplied to the IC chip 240 irregularly. The measuring unit 221 measures the amount of power supplied to the IC chip 240 in real-time.

The determining unit 223 determines whether the amount of power measured by the measuring unit 221 is within a preset allowable range. The allowable range may represent a range of amounts of power receivable by the IC chip 240. The allowable range may be preset or defined during a design stage or set-up stage of the IC chip 240. For example, the allowable range may differ based on purposes of electronic components, and may be set to be within 3 W to 5 W.

The detecting unit 225 detects wireless power transmission interference having mutual resonance when the measuring unit 221 measures an amount of power greater than or outside the preset allowable range. For example, when the amount of power measured by the measuring unit 221 is 6 W, the detecting unit 225 detects wireless power transmission interference having mutual resonance.

The detecting unit 225 detects a malfunction in the IC chip 240. For example, when a value of electric current or voltage output from the IC chip 240 is outside a preset range, the detecting unit 225 detects that the IC chip 240 is malfunctioning.

The switch control unit 227 operatively connects the plurality of capacitors 217 to the PCB 210 in series or in parallel when the detecting unit 225 detects the wireless power transmission interference having mutual resonance. In the alternative, the switch control unit 227 operatively connects the plurality of capacitors 217 to the PCB 210 in series or in parallel when the detecting unit 225 detects that the IC chip 240 is malfunctioning.

The switch control unit 227 operatively connects the plurality of capacitors 217 to the power plane 211 and the ground plane 213 in series by controlling the switch 215 to increase the resonance frequency of the PCB 210 to be higher than a resonance frequency of the wireless power transmission apparatus experiencing mutual resonance. When the plurality of capacitors 217 are operatively connected in series, the capacitance of the PCB 210 decreases. When the capacitance of the PCB 210 decreases, the resonance frequency of the PCB 210 increases.

The switch control unit 227 operatively connects the plurality of capacitors 217 to the power plane 211 and the ground plane 213 in parallel by controlling the switch 215 to reduce the resonance frequency of the PCB 210 to be lower than the resonance frequency of the wireless power transmission apparatus experiencing mutual resonance. When the plurality of capacitors 217 are connected in parallel, the capacitance of the PCB 210 is increased. In response to the capacitance of the PCB 210 increasing, the resonance frequency of the PCB 210 decreases.

The communication unit 230 transmits and receives information associated with the resonance frequency of the wireless power transmission apparatus experiencing mutual resonance and information associated with the resonance frequency of the PCB 210 to and from the wireless power transmission apparatus experiencing mutual resonance. The resonance frequency control unit 220 controls the resonance frequency of the PCB 210 based on the information the communication unit 230 received associated with the resonance frequency of the wireless power transmission apparatus.

The IC chip 240 may be supplied with power from the power source through a conduit (not shown) operatively connecting the power plane 211 to the ground plane 213.

Figure 3:
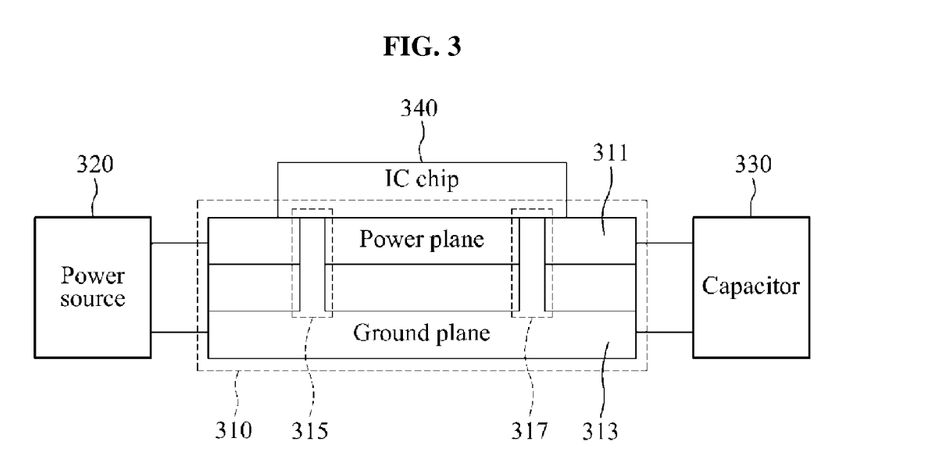
FIGS. 3 and 4 are diagrams illustrating a configuration of a printed circuit board (PCB) of an apparatus to control a resonance frequency of a device subject to wireless power transmission interference, according to an embodiment.
Figure 4:
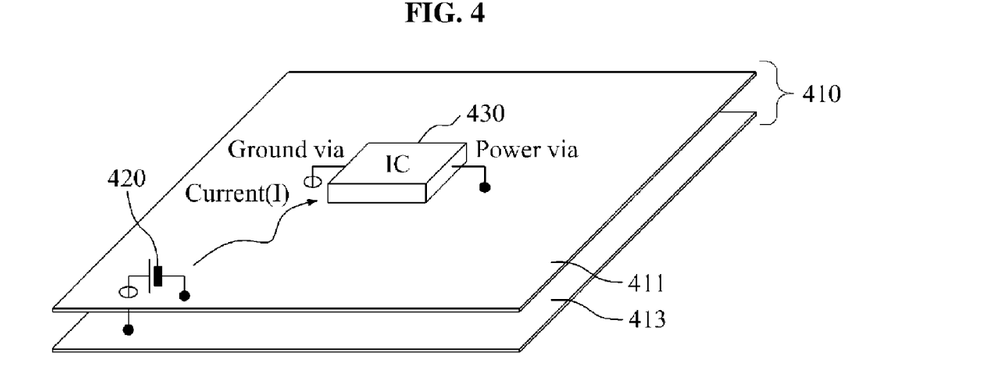

FIGS. 3 and 4 are diagrams illustrating a configuration of a PCB 310 of an apparatus to control a resonance frequency of a device subject to wireless power transmission interference, according to an embodiment.

Referring to FIG. 3, the PCB 310 may include a power plane 311, a ground plane 313, a conduit 315, and a conduit 317. The conduit 315 and the conduit 317 may extend through the PCB 310 to electrically connect the power plane 311 with the ground plane 313. The conduit 315 and the conduit 317 may be used to supply power to an IC chip 340.

A power source 320 may be connected to the power plane 311 and the ground plane 313. Power from the power source 320 is supplied to the IC chip 340 through the conduit 315 and the conduit 317.

A capacitor 330 is operatively connected to the power plane 311 and the ground plane 313. In one example, when the capacitor 330 corresponds to a variable capacitor, a resonance frequency of the PCB 310 differs based on a capacity of the capacitor 330. The capacitor 330 is connected to the power plane 311 and the ground plane 313 in series or in parallel. The resonance frequency of the PCB 310 may differ based on a series connection or a parallel connection.

Referring to FIG. 4, a PCB 410 of an apparatus to control a resonance frequency of a device subject to wireless power transmission interference, according to an embodiment, includes a power plane 411 and a ground plane 413. A power source 420 is modeled as a battery operatively connected between the power plane 411 and the ground plane 413. Power stored in the power source 420 is delivered to an IC chip 430 on the PCB 410 through the power plane 411 and the ground plane 413 of the PCB 410. The IC chip 430 is supplied with power by a conduit, also known as a pillar, to the power plane 411 and the ground plane 413 of the PCB 410. A capacitor is operatively connected to the PCB 410 to prevent a resonance frequency of the PCB 410 from being equal to a resonance frequency of the wireless power transmission apparatus.

Figure 5:
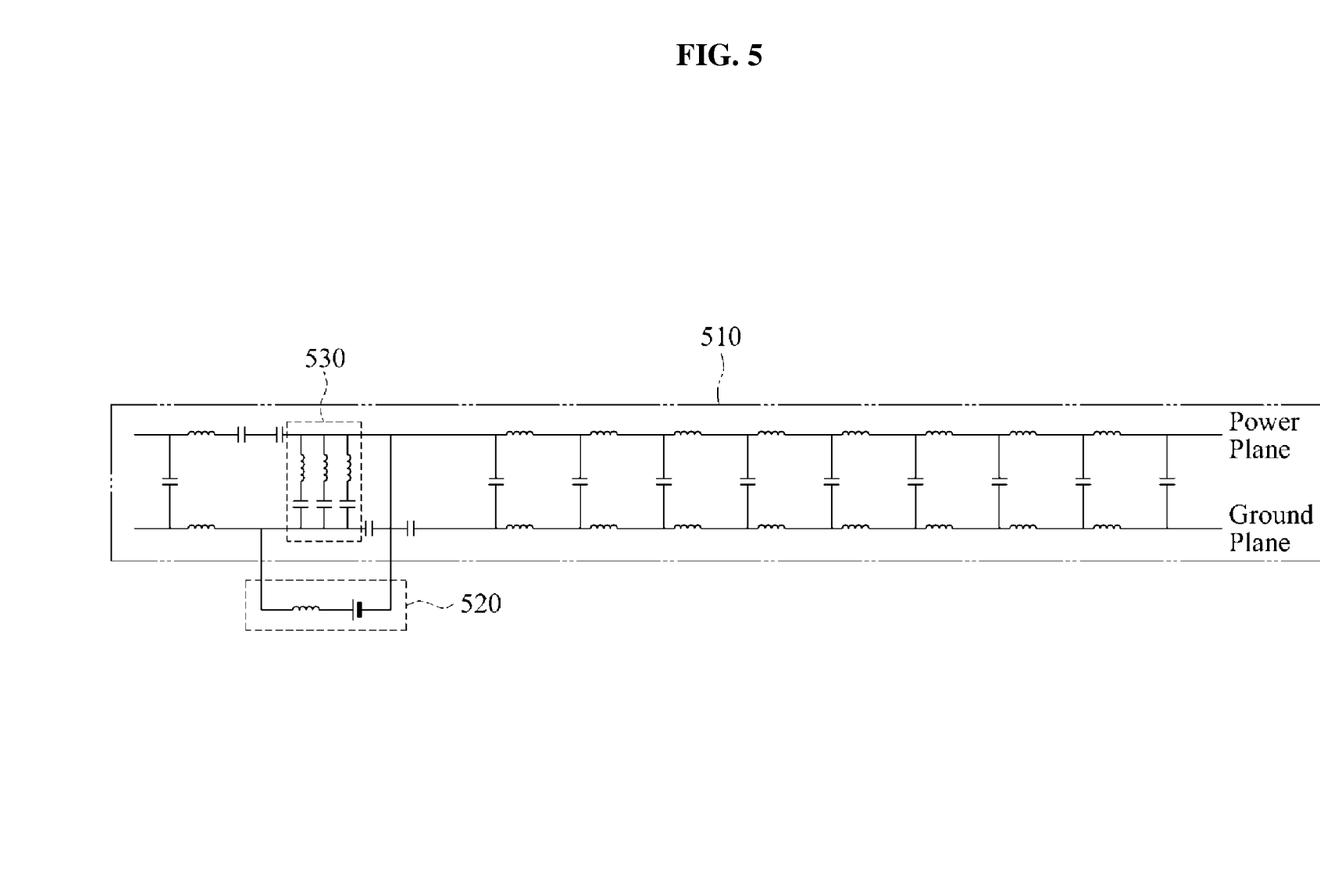
FIG. 5 is a diagram illustrating an equivalent circuit of an apparatus to control the resonance frequency of the device subject to wireless power transmission interference, according to an embodiment.

FIG. 5 is a diagram illustrating an equivalent circuit of an apparatus to control the resonance frequency of the device subject to wireless power transmission interference, according to an embodiment.

Referring to FIG. 5, a PCB 510 includes a power plane and a ground plane. The power plane and a ground plane are modeled as an inductor and a resistor. A power source 520 is modeled as a battery and an inductor. The space between the power plane and the ground plane are modeled as capacitors.

A decoupling capacitor 530 is operatively connected between the power plane and the ground plane to adjust a resonance frequency of the PCB 510. In this example, decoupling refers to eliminating the coupling with a nearby wireless power transmission apparatus. A resonance frequency control unit (not shown) determines a capacity or connection configuration of the decoupling capacitor 530.

Figure 6:
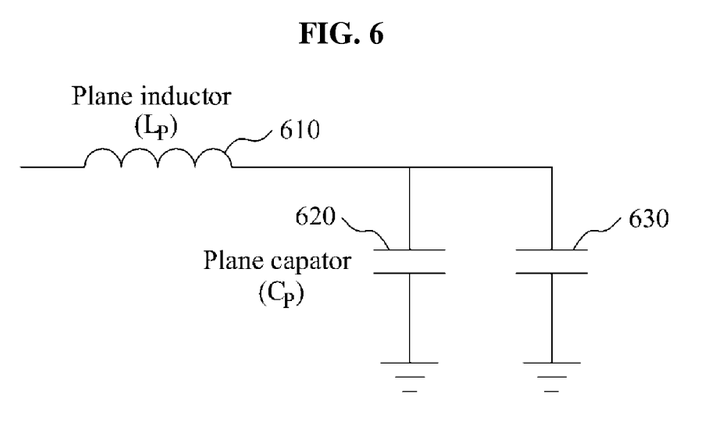
FIG. 6 is a diagram illustrating a circuit representing the equivalent circuit of FIG. 5, according to an embodiment.

FIG. 6 is a diagram illustrating a circuit representing the equivalent circuit of FIG. 5, in accordance with an embodiment.

Referring to FIG. 6, the circuit is a model, in a simple form, of an impedance of the power plane 411 and an impedance of the ground plane 413 of FIG. 4, and an impedance between the power plane 411 and the ground plane 413 of FIG. 4, viewed from a conduit through which power is supplied to the IC chip 430. Also, the circuit may represent the equivalent circuit of FIG. 5, in a simple form, as a combination of an inductor 610 and a capacitor 620.

The inductor 610 is a model representation of a power source, a power plane, and a ground plane. The capacitor 620 is a model representation of a capacitor between the power plane and the ground plane. A capacitor 630 is a model representation of a decoupling capacitor. When a connection of the capacitor 630 is established, an overall capacitance of a PCB is changed, and as a result, a resonance frequency of the PCB may be changed. For decoupling, the capacitor 630 may be operatively connected to the capacitor 620 in series or in parallel. In a case in which the capacitor 630 corresponds to a variable capacitor, the resonance frequency of the PCB 110 or 210, as shown in FIGS. 1 and 2, respectively, may be changed by changing the capacity of the capacitor 630 in such a state that the capacitor 630 is operatively connected to the capacitor 620.

Figure 7:
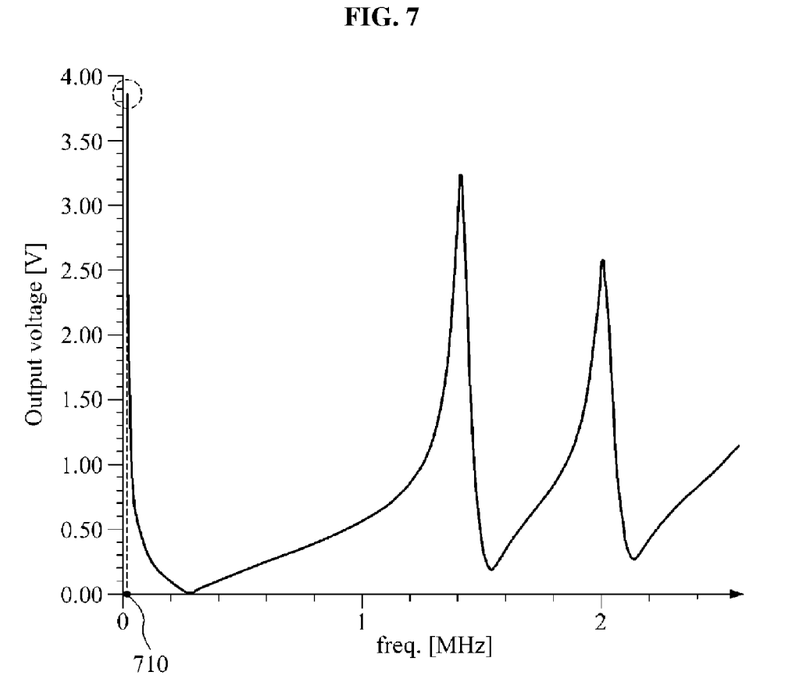
FIG. 7 is a graph illustrating the resonance frequency of the device subject to wireless power transmission interference in an absence of resonance frequency control, according to an embodiment.

FIG. 7 is a graph illustrating the resonance frequency of the device subject to wireless power transmission interference in an absence of resonance frequency control, according to an embodiment.

Referring to FIG. 7, the graph illustrates a resonance frequency of a PCB in the absence of resonance frequency control. A resonance frequency 710 between an inductor and a capacitor of the PCB may be close to a resonance frequency used in wireless power transmission, for example, hundreds of kHz. When the resonance frequency of the PCB is very close to the resonance frequency used in wireless power transmission, a great amount of energy may be delivered from the wireless power transmission apparatus to the PCB through mutual resonance, which makes it difficult to achieve a stable supply of power from a power plane and a ground plane of the PCB.

Figure 8:
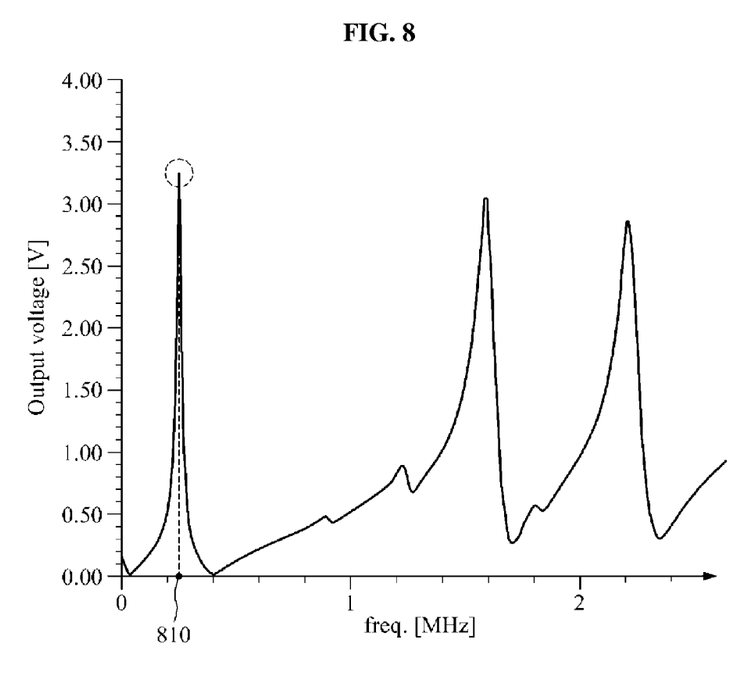
FIG. 8 is a graph illustrating the resonance frequency of the device subject to wireless power transmission interference under the control of the resonance frequency, according to an embodiment.

FIG. 8 is a graph illustrating the resonance frequency of the device subject to wireless power transmission interference under the control of the resonance frequency, according to an embodiment.

Referring to FIG. 8, the graph illustrates a resonance frequency of a PCB under the control of the resonance frequency of the PCB. A resonance frequency 810 may be increased by connecting a decoupling capacitor to the PCB.

When the resonance frequency of the PCB is outside a resonance frequency band used in wireless power transmission, a power plane and a ground plane of the PCB may become unstable and, consequently, destabilize a supply of power. A resonance frequency occurrence position may be adjusted freely, for instance, by adjusting a capacity of the connected decoupling capacitor. Also, the resonance frequency occurrence position may be adjusted freely based on a series or parallel connection of the decoupling capacitor.

Figure 9:
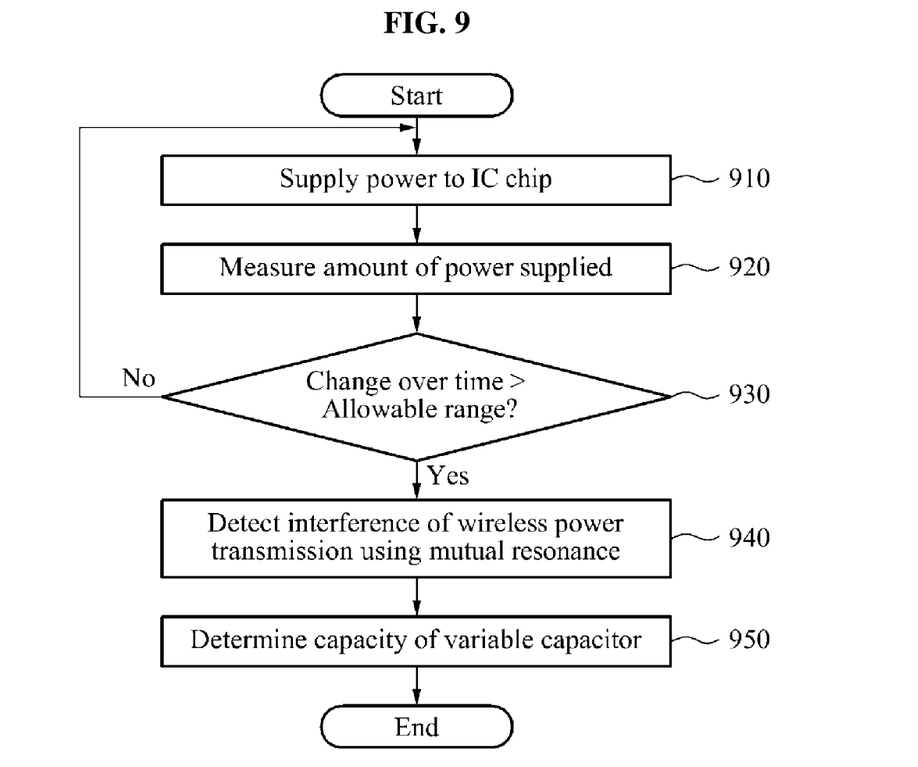
FIG. 9 is a flowchart illustrating a method to control the resonance frequency of the device subject to wireless power transmission interference, according to an embodiment.

FIG. 9 is a flowchart illustrating a method to control the resonance frequency of the device subject to wireless power transmission interference, according to an embodiment. FIG. 9 illustrates the method for an apparatus to control a resonance frequency of a device subject to wireless power transmission interference, hereinafter referred to as a resonance frequency control apparatus.

At operation 910, the method supplies power to an IC chip, through a PCB, while exposed to a wireless power transmission environment having mutual resonance. The PCB includes a variable capacitor to change a resonance frequency of the PCB.

At operation 920, the method measures an amount of power supplied to the IC chip.

At operation 930, the method determines whether the amount of power measured is within a preset allowable range.

At operation 940, the method detects wireless power transmission interference having mutual resonance when the amount of power measured is outside the preset allowable range.

At operation 950, the method determines a capacity of the variable capacitor based on a change in a supply of power from the PCB, when the wireless power transmission interference having mutual resonance is detected.

The PCB includes a plurality of capacitors to change the resonance frequency of the PCB, and at operation 950, the method connects the plurality of capacitors to the PCB in at least one connection configuration of a series connection and a parallel connection when the wireless power transmission interference having mutual resonance is detected.

The method of the resonance frequency control apparatus transmits and receives information associated with a resonance frequency of the wireless power transmission apparatus experiencing mutual resonance with the PCB and information associated with the resonance frequency of the PCB to and from the wireless power transmission apparatus.

According to some embodiments, the resonance frequency control apparatus blocks an effect of interference on performance of an electronic device located near a wireless power transmission apparatus experiencing mutual resonance by controlling a resonance frequency of a PCB by adjusting a capacity of a variable capacitor or by connecting a capacitor in series or in parallel.

According to some embodiments, the resonance frequency control apparatus changes a resonance frequency of a PCB to a desired frequency by adjusting a capacity of a variable capacitor or by connecting a capacitor in series or in parallel.

According to some embodiments, the resonance frequency control apparatus improves functional reliability of an electronic device by considering, at the state of design of the electronic device, designs to adjust capacity of a variable capacitor and a series or parallel connection configuration of a capacitor to improve reliability.

According to some embodiments, the resonance frequency control apparatus achieves a stable supply of power from an electronic device to an IC chip to improve reliability and durability of the electronic device. To achieve such stability, the resonance frequency control apparatus removes a resonance frequency at which mutual resonance occurs by adjusting a capacity of a variable capacitor or connecting a capacitor in series or in parallel.

The units and apparatuses described herein may be implemented using hardware components. The hardware components may include, for example, controllers, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

The processes, functions, methods and/or software described above may be recorded, stored, or fixed in one or more non-transitory computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of non-transitory computer-readable media include magnetic media such as hard discs, floppy discs, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa. In addition, a non-transitory computer-readable storage medium may be distributed among computer systems connected through a network and non-transitory computer-readable codes or program instructions may be stored and executed in a decentralized manner.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus to control a device, the apparatus comprising:
   a printed circuit board (PCB) configured to supply power to an integrated circuit (IC) during exposure to a wireless power transmission environment; and
   a resonance frequency control unit configured to control a resonance frequency of the PCB based on the supply of power,
   wherein the controlled resonance frequency is different from a frequency used to transmit or receive a wireless power.

2. The apparatus of claim 1, wherein the PCB comprises:
   a power plane configured to supply power from a power source to the IC through a printed path on the PCB; and
   a ground plane configured to ground the power source and the IC.

3. The apparatus of claim 1, wherein the resonance frequency control unit comprises:
   a measuring unit configured to measure an amount of power supplied to the IC;
   a determining unit configured to determine whether the amount of power is within a range; and
   a detecting unit configured to detect wireless power transmission interference having mutual resonance when the amount of power measured is outside the range.

4. The apparatus of claim 3, wherein the detecting unit is configured to detect a malfunction in the IC.

5. The apparatus of claim 2, wherein the PCB comprises a variable capacitor operatively connected between the power plane and the ground plane, and
   the resonance frequency control unit comprises a capacitor capacity determining unit configured to determine a capacity of the variable capacitor based on the change in the supply of power.

6. The apparatus of claim 5, wherein the capacitor capacity determining unit is configured to decrease the capacity of the variable capacitor to increase the resonance frequency of the PCB to be higher than a resonance frequency of a wireless power transmission apparatus experiencing mutual resonance.

7. The apparatus of claim 5, wherein the capacitor capacity determining unit is configured to increase the capacity of the variable capacitor to decrease the resonance frequency of the PCB to be lower than a resonance frequency of a wireless power transmission apparatus experiencing mutual resonance.

8. The apparatus of claim 1, wherein the resonance frequency control unit is configured to control the resonance frequency of the PCB to a frequency, irrespective of the change in the supply of power from the PCB.

9. The apparatus of claim 2, wherein the IC chip is supplied with power from the power source through a conduit operatively connecting the power plane to the ground plane.

10. The apparatus of claim 2, wherein the PCB comprises capacitors operatively connected between the power plane and the ground plane, and
    the resonance frequency control unit comprises a switch control unit configured to control a switch to increase the resonance frequency of the PCB to be higher than a resonance frequency of a wireless power transmission apparatus experiencing mutual resonance, the switch being configured to operatively connect the capacitors to the power plane and the ground plane.

11. The apparatus of claim 1, wherein the switch control unit is configured to operatively connect the plurality of capacitors to the power plane and the ground plane in parallel and controlling a switch to reduce the resonance frequency of the PCB to be lower than a resonance frequency of a wireless power transmission apparatus experiencing mutual resonance.

12. The apparatus of claim 1, further comprising:
    a communication unit configured to transmit and receive information associated with a resonance frequency of a wireless power transmission apparatus experiencing mutual resonance and information associated with the resonance frequency of the PCB to and from the wireless power transmission apparatus.

13. A method of controlling a device, the method comprising:
    supplying power from a printed circuit board (PCB) to an integrated circuit (IC) during exposure to a wireless power transmission environment; and
    controlling a resonance frequency of the PCB based on the supply of power,
    wherein the controlled resonance frequency is different from a frequency used to transmit or receive a wireless power.

14. The method of claim 13, wherein the controlling comprises:
    measuring an amount of power supplied to the IC;
    determining whether the amount of power measured is within a range; and
    detecting wireless power transmission interference having mutual resonance when the amount of power measured is outside the range.

15. The method of claim 14, wherein the PCB comprises a variable capacitor configured to change the resonance frequency of the PCB, and
    the controlling further comprises determining a capacity of the variable capacitor based on the change in the supply of power from the PCB when the wireless power transmission interference having mutual resonance is detected.

16. The method of claim 14, wherein the PCB comprises capacitors configured to change the resonance frequency of the PCB, and
    the controlling further comprises operatively connecting the capacitors to the PCB in a connection configuration of a series connection and a parallel connection when the wireless power transmission interference having mutual resonance is detected.

17. The method of claim 13, further comprising:
    transmitting and receiving information associated with a resonance frequency of a wireless power transmission apparatus experiencing mutual resonance and information associated with a resonance frequency of the PCB to and from the wireless power transmission apparatus experiencing mutual resonance.

18. An apparatus to control a device subject to wireless power transmission interference, comprising:

a variable capacitor configured to adjust a capacity of a printed circuit board (PCB) and enable the PCB to supply power to an integrated circuit (IC); and a resonance frequency control unit configured to control a resonance frequency of the PCB by adjusting the capacity of the variable capacitor based on the power supplied to the IC, wherein the controlled resonance frequency is different from a frequency used to transmit or receive a wireless power.

19. The apparatus of claim 18, wherein the resonance frequency control unit changes the capacity of the variable capacitor when wireless power transmission interference with mutual resonance is detected between the device and the PCB or when the IC malfunctions.

20. The apparatus of claim 18, wherein the resonance frequency control unit changes the resonance frequency of the PCB when a value of electric current input to the IC or a value of voltage applied to the IC is outside a range.

21. The apparatus of claim 18, wherein the variable capacitor is integrated into the PCB, operatively connected between a power plane and a ground plane of the PCB.

22. The apparatus of claim 18, wherein the resonance frequency control unit determines a larger capacity of the variable capacitor as the change in power being supplied is larger and when a change in the resonance frequency of the PCB is greater.

23. The apparatus of claim 18, wherein the resonance frequency control unit determines a lower capacity of the variable capacitor as the change in a supply of power decreases and when a change in the resonance frequency of the PCB is lower.

24. The apparatus of claim 18, wherein the resonance frequency control unit calculates an amount of power supplied to the IC periodically or irregularly in real-time.

* * * * *